(12) United States Patent
Hendricks

(10) Patent No.: US 6,408,031 B1
(45) Date of Patent: Jun. 18, 2002

(54) SINGLE BIT SIGMA DELTA FILTER WITH INPUT GAIN

(75) Inventor: Paul David Hendricks, Coopersburg, PA (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/428,086

(22) Filed: Oct. 27, 1999

(51) Int. Cl.$^7$ ................................. H04B 14/06
(52) U.S. Cl. .................. 375/247; 375/350; 341/143; 341/144; 341/155; 708/307
(58) Field of Search .................. 375/229, 247, 375/350; 341/143, 144, 126, 155; 708/307

(56) References Cited

U.S. PATENT DOCUMENTS

| | | | |
|---|---|---|---|
| 5,629,701 A | * | 5/1997 | Ritoniemi et al. .......... 341/143 |
| 5,736,950 A | * | 4/1998 | Harris et al. ................ 341/143 |
| 5,757,299 A | * | 5/1998 | Noro et al. .................. 341/143 |
| 6,191,715 B1 | * | 2/2001 | Fowers ........................ 341/120 |

* cited by examiner

Primary Examiner—Stephen Chin
Assistant Examiner—Dac V. Ha
(74) Attorney, Agent, or Firm—Mark A. Kurisko

(57) ABSTRACT

A digital system for filtering a single bit input signal according to the transfer function H(z), wherein H(z) has a gain G, a pole at location $b_0$, and a zero at location $a_0$. The digital system filters the single bit input signal without using computationally expensive multibit multiplication. The digital system achieves these advantages with a digital circuit having a first gain stage generating a gain corrected signal, a delay element generating a delayed gain corrected signal, a feed-forward stage generating a feed-forward signal, and a summer for generating an output signal based upon the sum of the gain corrected signal, the delayed gain corrected signal and the feed-forward signal.

13 Claims, 4 Drawing Sheets

SINGLE BIT SIGMA DELTA FILTER WITH INPUT GAIN

FIELD OF THE INVENTION

This invention relates to digital filtering of a single bit data stream input. Particularly, it relates to an architecture for an improved digital filter that requires less complex computations.

BACKGROUND OF THE INVENTION

Digital filters, such as Infinite Impulse Response (hereinafter "IIR") filters, have been implemented with Delta Modulator architectures. Delta modulation can be described as a type of Pulse Code Modulation where only 1-bit encoding is used. One-bit encoding is made possible by a feedback loop which is an integral part of the encoding process. FIG. 3 illustrates exemplary components of a Delta modulation system applicable to a single message. The overall action of the Delta modulator is to transmit 1-bit information about the changes in f(t) over time.

It is also known in the art that systems using delta modulation are not well suited to messages having DC components and to messages having an approximately flat power spectrum. Delta modulation performs most favorably when the message has no DC component and when the power density spectrum decreases with increasing frequency. A modified delta modulation system, called Delta Sigma Modulation, exits that performs better with DC components and flat power spectrum density. Delta Sigma Modulation (also called Sigma Delta Modulation) is formed by adding one integrator and one differentiator to a basic Delta Modulation system.

FIG. 4 shows a known Sigma Delta architecture for implementing a first order IIR filter. The first order filter sections can be implemented with the denominator coefficient multiplying the single bit output in a feedback configuration and the numerator coefficient multiplying the single bit input in a feedforward configuration. In particular, FIG. 4 illustrates a summing node 50 that receives and sums together inputs from the input signal 52, a delayed feedforward term from a module 54, and a feedback term output from a sigma delta modulator 56.

The numerator or feedforward term of FIG. 4 consists of a register containing the value of the zero $a_0$. The feedforward term is added at the input summing node using a simple adder. The feedback term consists of a register containing the value of the pole $b_0$. As with the feedforward term, this multiplication is performed by simply adding or subtracting register values which contain the partial feedback coefficients $(1-b_0)$.

Often, in addition to implementing the filter transfer function, applications exist where it is desirable to add gain or attenuation into the system. In the case where the zero is chosen to lie on the unit circle, the single input then takes the form of an addition or subtraction. However, for the more generalized case where the numerator coefficient is not equal to 1 (i.e. not on the unit circle) the ability to add gain into the system requires a (multibit)×(multibit) multiplication due to the gain factor being multiplied by the non-unity numerator coefficient. (Multibit)×(multibit) multiplication is more complicated and computationally more expensive that single bit multiplication. Single bit multiplication can be implemented with simple adders and/or subtractors, while multibit×multibit multiplication requires a hardware multiplier.

Accordingly, there is a need to implement a digital filter having a gain or attenuation value that does not require a (multibit)×(multibit) multiplication.

SUMMARY OF THE INVENTION

Computationally expensive multiplication can be reduced in a digital circuit for filtering an input signal, according to the invention, with a digital circuit having a first gain stage, a delay element, a feed-forward stage, and a summer. The first gain stage generates a gain corrected signal by multiplying the input by a gain G. The delay element forms a delayed gain corrected signal by delaying the gain corrected signal for one cycle. The feed-forward stage generates a feed-forward signal by delaying and multiplying the input signal by a gain B. The summer then generates an output signal by summing together the gain corrected signal, the delayed gain corrected signal, and the feed-forward signal. The architecture of the digital circuit allows for digital filtering of the input signal without computationally expensive multibit×multibit multiplications.

Another aspect of the invention provides for a method of filtering an input signal. The method includes generating a gain corrected signal; forming a delayed gain corrected signal; generating a feed-forward signal; and summing together the gain corrected signal, the delayed gain corrected signal and the feed-forward signal to generate an output signal. The gain corrected signal is generating by multiplying the input signal by a gain G. The delayed gain corrected signal is formed by delaying the gain corrected signal for one cycle. The feed-forward signal is generated by delaying the input signal by one cycle and by multiplying the delayed input signal by a gain B.

BRIEF DESCRIPTION OF THE DRAWINGS

The features and advantages of the invention will be apparent from the following description, as illustrated in the accompanying Figures in which like reference characters refer to the same elements throughout the different views.

DETAILED DESCRIPTION

Figure 1:
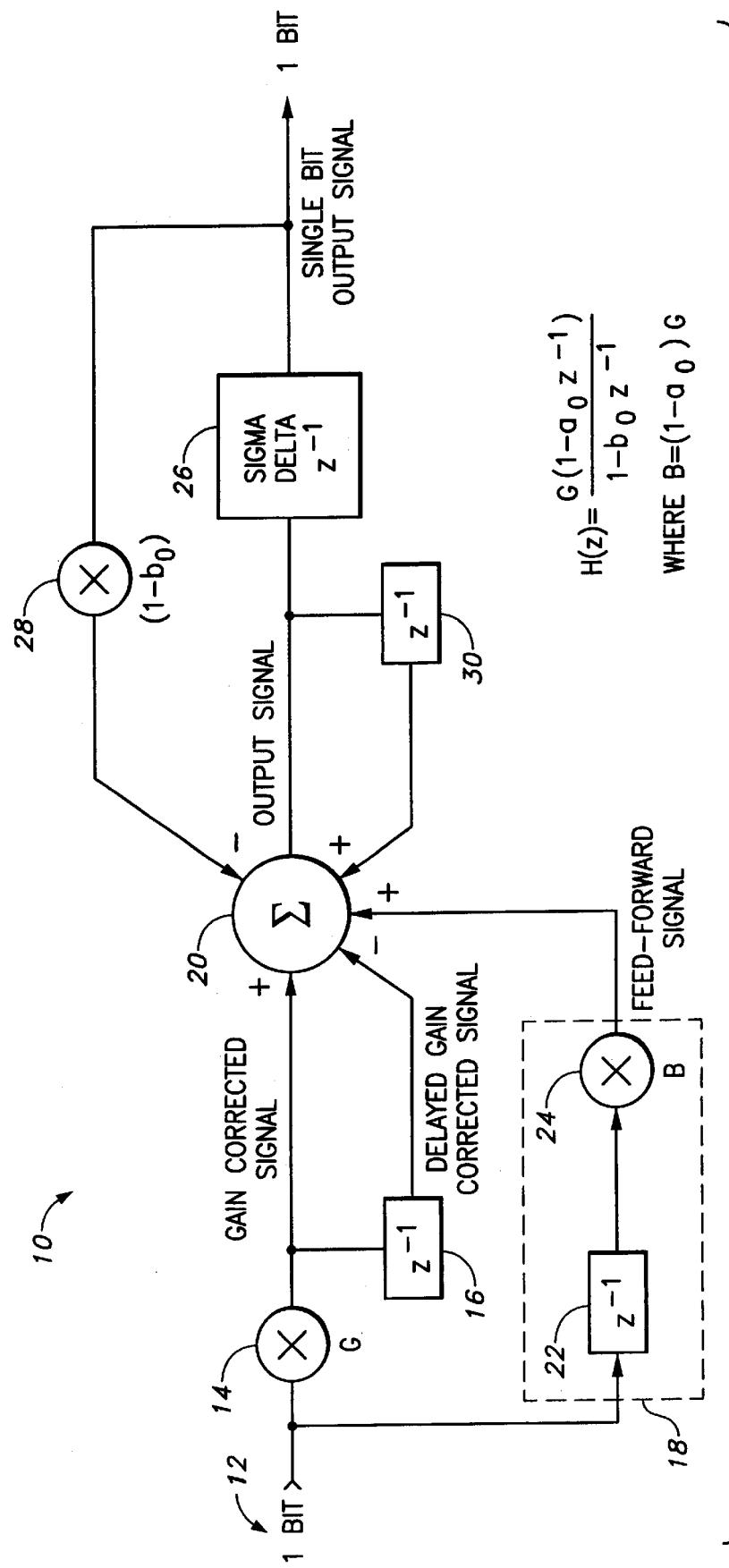
FIG. 1 shows a digital circuit in accordance with principles of the invention.

FIG. 1 shows a digital circuit 10 in accordance with principles of the invention. The digital circuit includes a first gain stage 14, a delay element 16, a feed-forward stage 18, and a summer 20. The first gain stage 14 generates a gain corrected signal by multiplying the input by a gain G. The delay element 16 forms a delayed gain corrected signal by delaying the gain corrected signal for one cycle. The feed-forward stage 18 generates a feed-forward signal by delaying and multiplying the input signal by a gain B. The summer 20 then generates an output signal by summing together the gain corrected signal, the delayed gain corrected signal, and the feed-forward signal.

Figure 2:
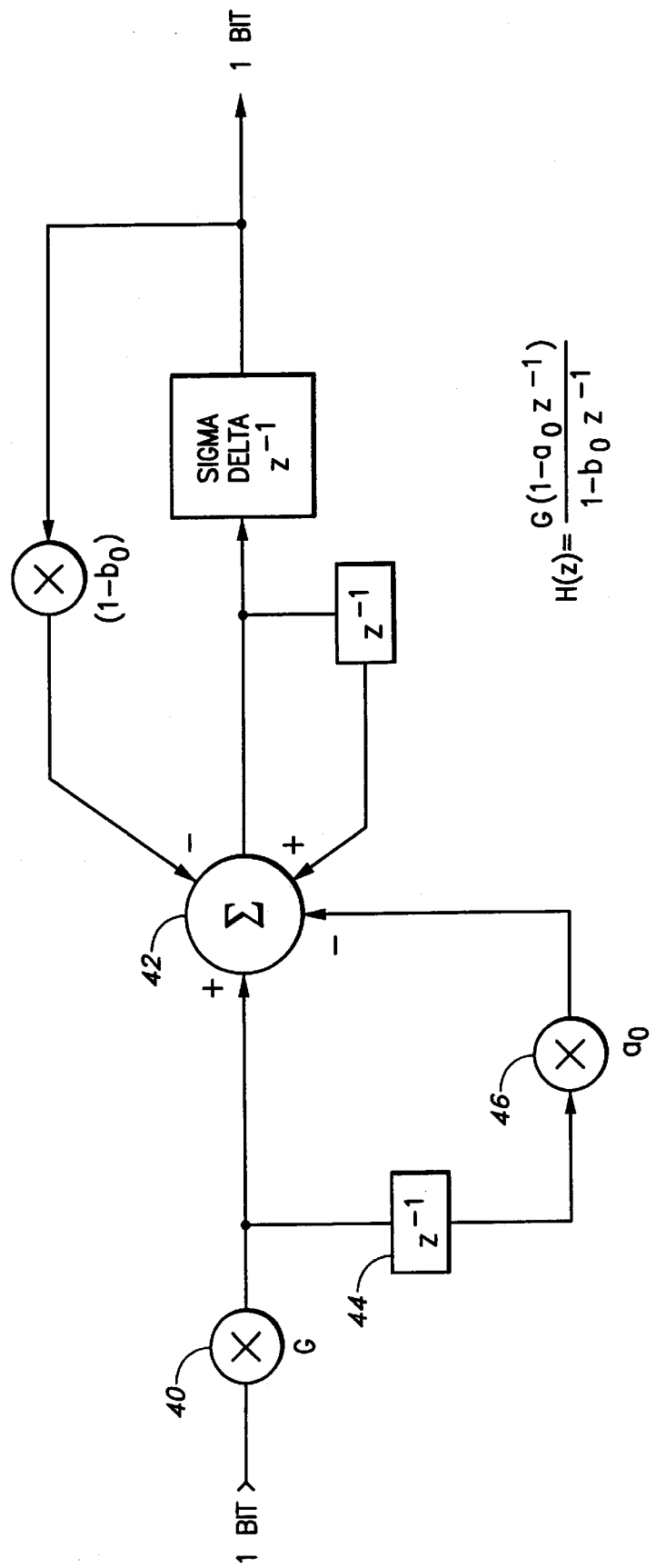
FIG. 2 shows a digital filter having a multibit×multibit multiplication.
Figure 3:
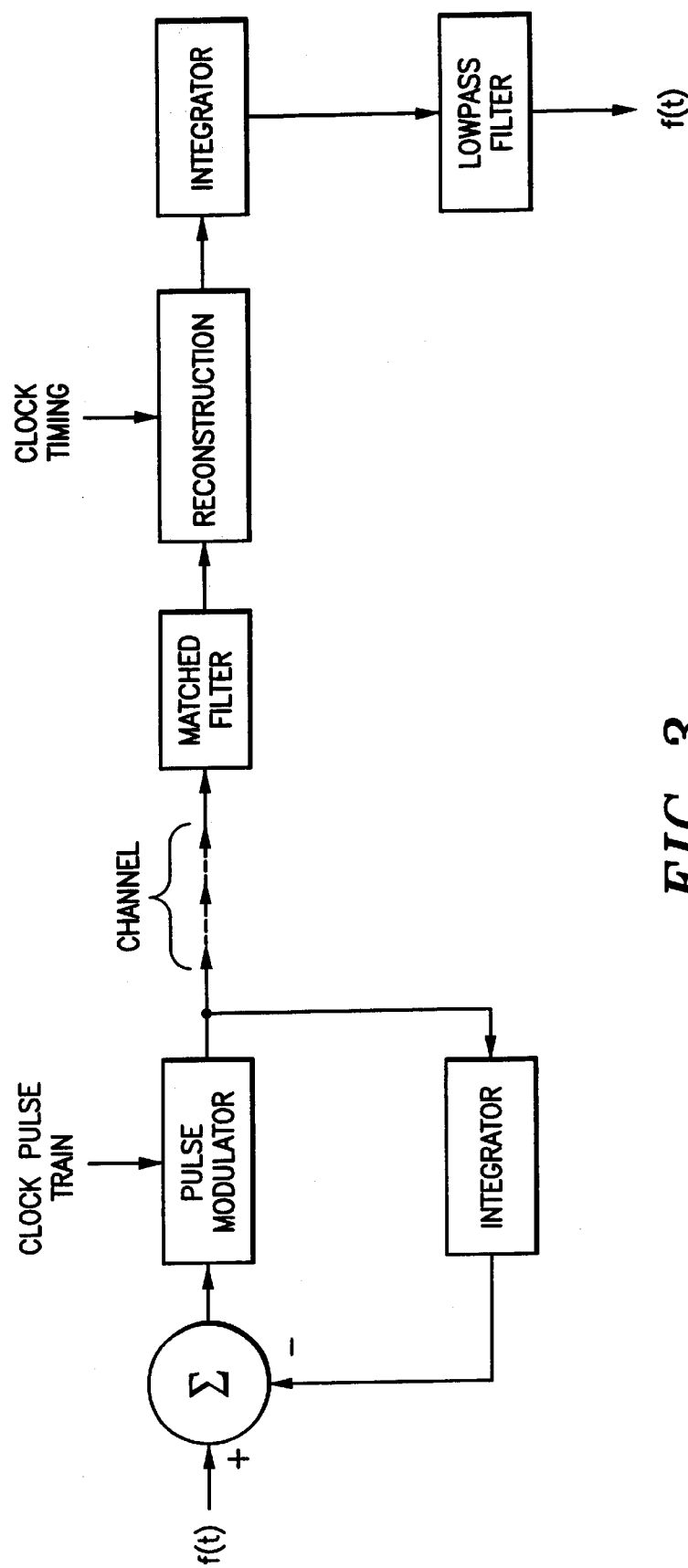
FIG. 3 illustrates a known Delta Modulator system.
Figure 4:
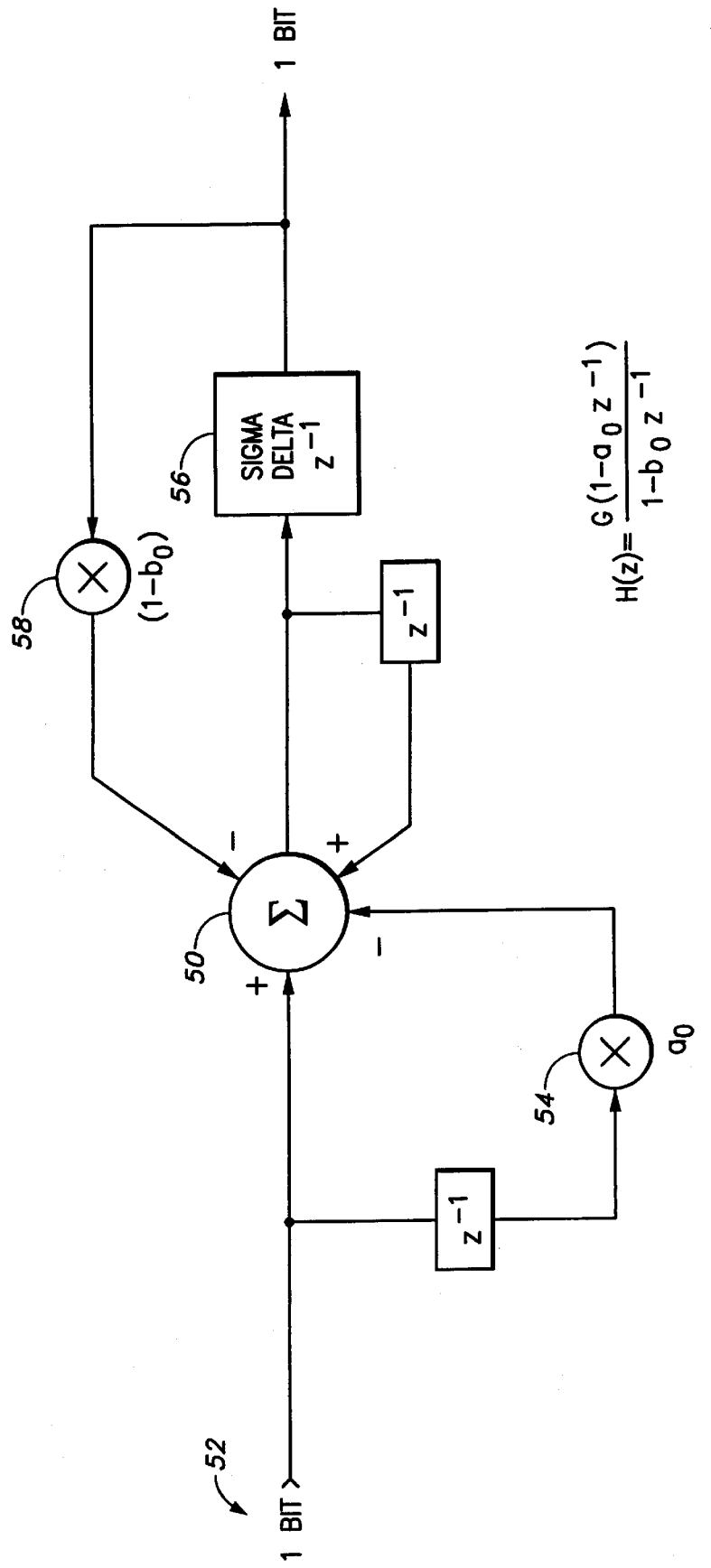
FIG. 4 shows a known Sigma Delta architecture for implementing a digital filter.

FIG. 2 shows a single bit digital filter having a multibit× multibit multiplication. In particular, the illustrated digital filter includes the known digital filter of FIG. 4 with an additional gain element 40 that multiplies the input bit stream by a gain G. The output of the additional gain element 40 is a multibit output. The multibit output goes directly into the summing node 42 and also goes to the delay element 44. The multibit output of the delay element 44 is operably coupled to another gain element 46 of gain $a_0$. As a result, a multibit×multibit operation is required in the gain element 46. The gain element 46 needs a hardware multiplier, and thus the simplicity and hardware efficiency of using only adders and/or subtractors to perform the multiplications in the digital circuit is lost.

With further reference to FIG. 1, the invention provides the ability to filter the input data stream 12 without a multibit×multibit operation and the associated hardware multiplier. Particularly, by introducing the feed-forward stage 18, the digital circuit can multiply the input by a gain G without requiring constraints on the location of the poles and zeros of the transfer function of the digital circuit, and without the need to implement any multibit×multibit operations. As shown in FIG. 1, the digital filter can be implemented utilizing only adders and/or subtractors and delay elements.

The feed-forward stage 18 can include a delay element 22 and a gain stage 24. The delay element 22 delays the input to the feed-forward stage 18 by one cycle. The gain stage 24, preferably implemented with a register, multiplies the input to the feed-forward stage 18 by a gain B. The gain B is typically set equal to $(1-a_0)G$, where $a_0$=the value of the desired zero in the transfer function of the digital circuit 10.

In other embodiments of the invention, the digital circuit 10 can include a delta modulator 26. The delta modulator 26 converts the output signal into a single bit output signal. The single bit output signal typically identifies the changes in the output signal over time. Further information on delta modulators can be found in "Digital Communication Systems", by Peyton Peebles, Jr., Prentice-Hall, 1987, the contents of which are incorporated herein by reference. In a preferred aspect of the invention, the delta modulator 26 is a sigma delta modulator.

As further illustrated in FIG. 1, the output of the delta modulator 26 can be fedback to summer 20. The feedback signal from the delta modulator 26 is passed through a second gain stage 28. The second gain stage multiplies the single bit output signal by a gain $1-b_0$, where $b_0$ is the value of the desired pole in the transfer function of the digital circuit 10. The second gain stage 28 can be implemented using a register containing the value $1-b_0$.

With further reference to FIG. 1, the gain stage 14 can be implemented using a register. The register can contain the value of the desired gain G. The digital circuit 10 can also include a second delay element 30. The second delay element forms a delayed version of the output signal and feeds this delayed version of the output signal back to the summer 20.

The transfer function of the digital circuit 10, where X=the input signal 12 and Y=the single bit output signal, can be solved as follows:

$$y = Gx - Gxz^{-1} + Bxz^{-1} + yz^{-1} - (1-b_0)yz^{-1}$$

Rearranging terms:

$$y - yz^{-1} + (1-b_0)yz^{-1} = Gx - Gxz^{-1} + Bxz^{-1}$$

Canceling and factoring terms results in:

$$y(1-b_0z^{-1}) = Gx(1-z^{-1}) + Bxz^{-1}$$

or H(z) then becomes:

$$H(z) = [G(1-z^{-1}) + Bz^{-1}]/[1-b_0z^{-1}]$$

If the scale factor B is picked such that:

$$B = (1-a_0)G,$$

where G is the desired gain of the transfer function and $a_0$ is the location of the zero of the transfer function then:

$$H(z) = [G(1-z^{-1}) + (1-a_0)Gz^{-1}]/[1-b_0z^{-1}]$$

Then H(z) simplifies to the desired result of:

$$H(z) = G(1-a_0)z^{-1}/(1-b_0z^{-1}).$$

In operation, the digital circuit of FIG. 1 can be used to filter a single bit input signal 12 according to the transfer function H(z), where the transfer function has a gain G, a pole at location $b_0$, and a zero at location $a_0$. The digital circuit 10 operates by generating a gain corrected signal, forming a delayed gain corrected signal, generating a feed-forward signal, and then summing together the gain corrected signal, the delayed gain corrected signal and the feed-forward signal to generate an output signal. The gain corrected signal is generating by multiplying the input signal by a gain G at the first gain stage 14. The delayed gain corrected signal is formed by delaying the gain corrected signal for one cycle at the delay element 16. The feed-forward signal is generated by delaying the input signal by one cycle and by multiplying the delayed input signal by a gain B at the feed-forward stage 18.

Other aspects of the invention provide for generating a single bit output signal as a function of the output signal from the summer 20. The single bit output signal can be generated using the delta modulator 26. The delta modulator 26 generates a single bit output signal that identifies the changes in the output signal over time. The single bit output signal can also be fedback to the summer 20. The feedback signal from the delta modulator 26 to the summer 20 is typically multiplied by a gain $1-b_0$.

While the invention has been shown and described having reference to specific preferred embodiments, those skilled in the art will recognize that variation in form and detail may be made without departing from the spirit and scope of the invention. Thus, specific details of the disclosure herein are not intended to be necessary limitations on the scope of the invention other than as required by the prior art.

I claim:

1. A digital circuit for filtering an input signal, comprising:
    a first gain stage for generating a gain corrected signal equal to the input signal multiplied by a gain G,
    a first delay element operably coupled to the gain stage for forming a delayed gain corrected signal,
    a feed-forward stage for generating a feed-forward signal equal to the input signal multiplied by a gain B and delayed by one cycle,
    a summer for generating an output signal based upon the sum of the gain corrected signal, the delayed gain corrected signal, and the feed-forward signal, and
    wherein the feed-forward stage includes a register containing the gain B, such that $B=(1-a_0)G$ and $a_0$=the value of the desired zero.

2. The digital circuit according to claim 1, wherein the first gain stage includes a register containing the gain G.

3. The digital circuit according to claim 1, further including a delta modulator for generating a single bit output signal based upon the output signal from the summer, the single bit output signal being fed-back to the summer.

4. The digital circuit according to claim 3, wherein the delta modulator is a sigma delta modulator.

5. The digital circuit according to claim 3, further including:

a second gain stage for multiplying the single bit output signal by a gain $1-b_0$, wherein $b_0$=the value of the desired pole.

6. The digital circuit according to claim 5, further including:

a second delay element for forming a delayed output signal that is fed-back to the summer, and a register in the feed-forward stage storing the gain B, wherein $B=(1-a_0)G$ and wherein $a_0$=the value of the desired zero, such that the transfer function H(z) of the digital circuit is $$H(z) = \frac{G(1 - a_0 z^{-1})}{1 - b_0 z^{-1}}.$$

7. The digital circuit according to claim 1, further including a second delay element for forming a delayed output signal that is fed-back to the summer.

8. An infinite impulse response filter, comprising:

a first gain stage for generating a gain corrected signal equal to the input signal multiplied by a gain G, a first delay element operably coupled to the gain stage for forming a delayed gain corrected signal, a feed-forward stage for generating a feed-forward signal equal to the input signal multiplied by a gain B and delayed by one cycle, wherein $B=(1-a_0)G$ and $a_0$=the value of the desired zero, a summer for generating an output signal based upon the sum of the gain corrected signal, the delayed gain corrected signal, and the feed-forward signal, a delta modulator for generating a single bit output signal based upon the output signal from the summer, a second gain stage for multiplying the single bit output signal by a gain $1-b_0$, wherein $b_0$=the value of the desired pole, a second delay element for forming a delayed output signal that is fed-back to the summer, such that the transfer function H(z) of the filter is $$H(z) = \frac{G(1 - a_0 z^{-1})}{1 - b_0 z^{-1}}.$$

9. A method of filtering an input signal, comprising:

generating a gain corrected signal by multiplying the input signal by a gain G, forming a delayed gain corrected signal by delaying the gain corrected signal for one cycle, generating a feed-forward signal by delaying the input signal by one cycle and by multiplying the delayed input signal by a gain B, summing the gain corrected signal, the delayed gain corrected signal and the feed-forward signal to generate an output signal, and wherein the generating step includes the step of multiplying the delayed input signal by a gain B, wherein $B=(1-a_0)G$ and $a_0$=the value of the desired zero.

10. The method according to claim 9, further including the steps of:

generating a single bit output signal identifying the changes in the output signal over time, and feeding back the single bit output signal.

11. The method according to claim 10, wherein the step of generating a single bit output signal is performed using a delta modulator.

12. The method according to claim 10, further including the step of:

multiplying the single bit output signal by a gain $1-b_0$, wherein $b_0$=the value of the desired pole.

13. The method according to claim 12, wherein $B=(1-a_0)G$ and $a_0$=the value of the desired zero, further including the steps of:

forming a delayed output signal by delaying the output signal for one cycle, and feeding-back the delayed output signal, such that the input signal if filtered according to the transfer function $$H(z) = \frac{G(1 - a_0 z^{-1})}{1 - b_0 z^{-1}}.$$

* * * * *